(12) United States Patent
Umeda et al.

(10) Patent No.: US 8,004,148 B2
(45) Date of Patent: Aug. 23, 2011

(54) SURFACE ACOUSTIC WAVE ELEMENT

(75) Inventors: Takatoshi Umeda, Kitahiro (JP); Shuichi Kawano, Shiojiri (JP); Satoshi Fujii, Sanda (JP)

(73) Assignee: Seiko Epson Corporation (JP)

( * ) Notice: Subject to any disclaimer, the term of this patent is extended or adjusted under 35 U.S.C. 154(b) by 197 days.

(21) Appl. No.: 12/535,945

(22) Filed: Aug. 5, 2009

(65) Prior Publication Data
US 2010/0038993 A1 Feb. 18, 2010

(30) Foreign Application Priority Data

Aug. 13, 2008 (JP) ................................ 2008-208585
Oct. 10, 2008 (JP) ................................ 2008-264011

(51) Int. Cl.
*H03H 9/25* (2006.01)
(52) U.S. Cl. ................. 310/313 B; 310/313 R; 310/340
(58) Field of Classification Search .............. 310/313 B, 310/313 R, 340
See application file for complete search history.

(56) References Cited

U.S. PATENT DOCUMENTS

| | | | |
|---|---|---|---|
| 5,446,329 A | | 8/1995 | Nakahata et al. |
| 5,446,330 A | * | 8/1995 | Eda et al. .................. 310/313 R |
| 5,814,918 A | | 9/1998 | Nakahata et al. |
| 7,439,649 B2 | | 10/2008 | Fujii et al. |
| 2002/0027485 A1 | * | 3/2002 | Shin .............................. 333/193 |
| 2003/0001696 A1 | * | 1/2003 | Yoshida et al. ............... 333/193 |
| 2005/0077982 A1 | * | 4/2005 | Funasaka ...................... 333/195 |
| 2009/0236935 A1 | * | 9/2009 | Kando ...................... 310/313 R |
| 2010/0187947 A1 | * | 7/2010 | Mimura .................... 310/313 A |

FOREIGN PATENT DOCUMENTS

| | | |
|---|---|---|
| JP | 3205976 | 7/2001 |
| JP | 3205978 | 7/2001 |
| JP | 2004-312198 | 11/2004 |
| JP | 2005-065050 | 3/2005 |
| JP | 2007-067734 | 3/2007 |
| JP | 2008-028980 | 2/2008 |

* cited by examiner

Primary Examiner — Thomas M Dougherty
(74) Attorney, Agent, or Firm — Harness, Dickey & Pierce, P.L.C.

(57) ABSTRACT

A surface acoustic wave element includes: a diamond layer; an alumina nitride layer provided on the diamond layer; a silicon oxide layer provided on the alumina nitride layer; and a pair of electrodes provided between the alumina nitride layer and the silicon oxide layer, the electrodes applying a voltage to the alumina nitride layer. If a thickness of the alumina nitride layer is represented by $H_1$, a thickness of the silicon oxide layer is represented by $H_2$, a wavelength of a surface acoustic wave is represented by $\lambda$, x is defined as $x=2\pi H_1/\lambda$, and y is defined as $y=2\pi H_2/\lambda$, (x, y) meets all of the following formulas 1 to 4 below. That is, the formula 1 is $y \leq 0.750 \times x+0.325$; the formula 2 is $y \leq -0.300 \times x+1.690$; the formula 3 is $y \geq -0.500 \times x+0.950$; and the formula 4 is $y \geq 0.700 \times x-0.610$.

4 Claims, 9 Drawing Sheets

[TABLE 1]

|  | MODE | x (-) | y (-) | TEMPERATURE COEFFICIENT (ppm/°C) | REFLECTION COEFFICIENT (%) | PROPAGATION LOSS (dB/λ) |
|---|---|---|---|---|---|---|
| EXAMPLE 2 | FIFTH ORDER | 3.06 | 3.14 | 6.0 | 2.0 | 0.03 |
| EXAMPLE 3 | SECOND ORDER | 1.36 | 0.70 | -1.0 | 5.5 | 0.05 |
| EXAMPLE 4 | THIRD ORDER | 1.36 | 1.05 | 0.0 | 6.5 | 0.02 |

FIG. 9

SURFACE ACOUSTIC WAVE ELEMENT

CROSS-REFERENCE TO RELATED APPLICATION

This application is based on and claims priority from Japanese Patent Application No. 2008-208585, filed on Aug. 13, 2008, the contents of which are incorporated herein by reference.

BACKGROUND

1. Technical Field

The present invention relates to a surface acoustic wave element.

2. Description of the Related Art

A surface acoustic wave element has been used as a filter, a resonator, or the like in an electric communication apparatus such as a cell phone. A surface acoustic wave element is an electromechanical conversion element using surface acoustic waves (hereafter referred to as "SAWs") that propagate over a surface of an elastic body (for example, see Japanese Patent No. 3205976).

A SAW element disclosed in Japanese Patent No. 3205976 includes a hard layer made of diamond, a ZnO layer (piezoelectric material layer) formed on the hard layer, a silicon dioxide layer (temperature compensation layer) formed on the ZnO layer, and an electrode (interdigital transducer (hereafter referred to as "IDT") formed between the ZnO layer and silicon dioxide layer. The IDT includes a pair of interdigital transducers. When an electrical signal is provided to the IDT, a voltage is applied between the pair of interdigital transducers. Then, a distortion occurs on the ZnO layer between the interdigital transducers due to an inverse piezoelectric effect, generating surface acoustic waves.

A frequency f, a phase velocity $V_p$, and a wavelength $\lambda$ of surface acoustic waves have a relation represented by a formula $f=Vp/\lambda$. The phase velocity $V_p$ depends on such as the vibration mode of surface acoustic waves and the material or thickness of the piezoelectric material layer, temperature compensation layer, and the like. The wavelength $\lambda$ depends on the vibration mode of surface acoustic waves, the interval between the interdigital transducers, and the like. As seen, the frequency f of surface acoustic waves is determined by the configuration of the SAW element. Therefore, electrical signals obtained by converting surface acoustic waves have a highly accurate frequency.

In recent years, electric communication apparatuses have been required to increase the communication rate or communication data capacity. Also, SAW elements have been required, for example, to increase the operating frequency thereof, stabilize characteristics thereof against temperature variations, and increase the conversion efficiency. As is understood from the above-mentioned formula, it is preferable to increase the phase velocity $V_p$ or reduce the wavelength $\lambda$ in order to increase the frequency. However, a reduction in the wavelength $\lambda$ requires a reduction in the interval between the interdigital transducers. This will increase the manufacturing cost. For this reason, as shown in Japanese Patent No. 3205976, a method of increasing the frequency by increasing the phase velocity $V_p$ is often used.

However, even if the technology disclosed in Japanese Patent No. 3205976 is used, characteristics other than the operating frequency may not be enhanced.

If ZnO is used as a piezoelectric material as in Japanese Patent No. 3205976, the reflection coefficient at the interdigital transducers, of surface acoustic waves generated between the interdigital transducers becomes relatively high. This is attributable to such as a large difference in hardness (Young's modulus) between the ZnO layer and interdigital transducers. If the reflection coefficient is increased, losses of surface acoustic waves are increased, resulting in reductions in the characteristics of the SAW element. Conversely, if the thickness of the interdigital transducers is reduced, the reflection coefficient is reduced. However, the interdigital transducers increase resistance thereof thereby degrading the electrical characteristics of the SAW element.

In order to avoid such a disadvantage, it is conceivably preferable to reduce the reflection coefficient by increasing Young' modulus of the piezoelectric material layer. However, if a piezoelectric material whose Young' modulus is different from ZnO's is used, the phase velocity $V_p$, electromechanical coupling coefficient, or the like will be changed. This will make a change in the operating frequency or conversion efficiency of the SAW element. Therefore, much effort must be expended to design a SAW element having desired characteristics.

In particular, while the characteristics of the SAW element are stabilized against temperature variations by providing a temperature compensation layer as described in Japanese Patent No. 3205976, an increase in the number of components makes it more difficult to design a SAW element. This makes it difficult to obtain a SAW element having desired characteristics. In other words, the characteristics of a SAW element cannot be enhanced.

SUMMARY

An advantage of the invention is to provide a SAW element that is allowed to increase the operating frequency and has good weather resistance and electrical characteristics.

A surface acoustic wave element according to a first aspect of the invention includes: a diamond layer; an alumina nitride layer provided on the diamond layer; a silicon oxide layer provided on the alumina nitride layer; and a pair of electrodes provided between the alumina nitride layer and the silicon oxide layer, the electrodes applying a voltage to the alumina nitride layer. If a thickness of the alumina nitride layer is represented by $H_1$, a thickness of the silicon oxide layer is represented by $H_2$, a wavelength of a surface acoustic wave is represented by $\lambda$, x is defined as $x=2\pi H_1/\lambda$, and y is defined as $y=2\pi H_2/\lambda$, (x, y) meets all of the following formulas 1 to 4. That is, the formula 1 is $y \leq 0.750 \times x + 0.325$; the formula 2 is $y \leq -0.300 \times x + 1.690$; the formula 3 is $y \geq -0.500 \times x + 0.950$; and the formula 4 is $y \geq 0.700 \times x - 0.610$.

By adopting the above-mentioned configuration, a distortion occurs in a portion of the alumina nitride layer (piezoelectric material layer) to which a voltage has been applied by the pair of electrodes. This distortion generates surface acoustic waves. The reflection coefficient of surface acoustic waves on the interface between the alumina nitride layer and the pair of electrodes is lower than the reflection coefficient of surface acoustic waves on the interface between a piezoelectric material layer, which is made of zinc oxide, and the pair of electrodes. Thus, the influence of the pair of electrodes upon the surface acoustic waves is reduced. Therefore, even if the thickness of the electrodes is not reduced, the reflection coefficient is reduced and thus surface acoustic waves are efficiently generated. As a result, the SAW element shows good electrical characteristics.

Also, while the diamond layer and alumina nitride layer soften due to a temperature increase, the silicon oxide layer hardens due to a temperature increase. The existence of the silicon oxide layer reduces characteristic variations of the whole surface acoustic wave element due to temperature variations.

As seen, since the surface acoustic wave element has a three-layer structure including the diamond layer, alumina nitride layer, and silicon oxide layer, the surface acoustic wave element shows good characteristics. For the surface acoustic wave element having such a structure, the electromechanical coupling coefficient, the phase velocity of surface acoustic waves, and the temperature dependencies of the electromechanical coupling coefficient and phase velocity depend on the thicknesses of the layers. For the diamond layer, if the thickness thereof is equal to or larger than a range over which the diamond layer vibrates in the thickness direction due to propagation of surface acoustic waves, the thickness does not have much influence on the characteristics of the surface acoustic wave element. On the other hand, for the alumina nitride layer and silicon oxide layer, if thicknesses thereof are changed, the characteristics of the surface acoustic wave element are significantly changed. However, it is unknown to what values the thicknesses of these layers should be set in order to set the electromechanical coupling coefficient, the phase velocity of surface acoustic waves, the temperature dependencies thereof, and the like to desired values. This makes it difficult to obtain a surface acoustic wave element having desired characteristics.

The inventors improved and developed a numerical model based on the finite element method (FEM) and then performed a numerical simulation while changing the thicknesses of the alumina nitride layer and silicon oxide layer. Also, the inventors evaluated the accuracy of the numerical simulation by conducting a comparative experiment and then confirmed that the accuracy of the simulation was sufficient. As for the phase velocity of SAWs, the difference between the experimental values and calculated values was several percent or less. This will be described in a working example 2 later. From the results of this numeral value simulation, the inventors found that the following extremely good characteristics were able to be obtained by setting the thickness $H_1$ of the aluminum layer and the thickness $H_2$ of the silicon oxide layer within a range meeting all of the above-mentioned the formulas 1 to 4.

Specifically, the phase velocity Vp in second order vibration mode of Sezawa waves was 9000 m/s or more, the electromechanical coupling coefficient K2 was approximately 0.2% or more, and the variation ratio of the frequency of surface acoustic waves in the temperature range of −45 to 85° C. fell within a range of ±1000 ppm. This will be described in detail in the DESCRIPTION OF EXEMPLARY EMBODIMENT section. Since the phase velocity $V_p$ was 9000 m/s or more, the frequency of surface acoustic waves can be increased (for example, 5.7 GHz or more). Therefore, the surface acoustic wave element is allowed to increase the frequency. Also, since the electromechanical coupling coefficient $K^2$ was approximately 0.2% or more, the efficiency of conversion between an electrical signal and a surface acoustic wave can be maintained. Therefore, the surface acoustic wave element can favorably function. Also, since the variation rate of the frequency to temperature variations fell within a range of ±1000 ppm, the surface acoustic wave element can stably operate against temperature variations.

As seen, by adopting the first aspect of the invention, a surface acoustic wave element having extremely good characteristics is obtained. Therefore, if this surface acoustic wave element is used in a bandpass filter or a reference clock source using second order vibration mode of Sezawa waves, an extremely high-performance device is obtained.

A surface acoustic wave element according to a second aspect of the invention includes: a diamond layer; an alumina nitride layer provided on the diamond layer; a silicon oxide layer provided on the alumina nitride layer; and a pair of electrodes provided between the alumina nitride layer and the silicon oxide layer, the electrodes applying a voltage to the alumina nitride layer. If a thickness of the alumina nitride layer is represented by $H_1$, a thickness of the silicon oxide layer is represented by $H_2$, a wavelength of a surface acoustic wave is represented by $\lambda$, x is defined as $x=2\pi H_1/\lambda$, and y is defined as $y=2\pi H_2/\lambda$, (x, y) meets all of the following formulas 5 to 8. That is, the formula 5 is $y \leq 0.818 \times x+0.682$; the formula 6 is $y \leq -0.266 \times x+2.960$; the formula 7 is $y \geq -0.700 \times x+2.200$; and the formula 8 is $y \geq 0.750 \times x-0.700$.

By adopting the above-mentioned configuration, a surface acoustic wave element having good electrical characteristics is obtained as in second order vibration mode. Specifically, the phase velocity Vp in third order vibration mode of Sezawa waves was 9000 m/s or more, the electromechanical coupling coefficient K2 was 0.2% or more, and the variation ratio of the frequency of surface acoustic waves in the temperature range of −45 to 85° C. fell within a rage of ±1000 ppm. This will be described in detail in the DESCRIPTION OF EXEMPLARY EMBODIMENT section. Therefore, the surface acoustic wave element is allowed to increase the frequency, as well as shows good weather resistance and electrical characteristics. Thus, if the surface acoustic wave element according to the second aspect of the invention is used in a bandpass filter or a reference clock source using third order vibration mode of Sezawa waves, an extremely high-performance device is obtained.

A surface acoustic wave element according to a third aspect of the invention includes: a diamond layer; an alumina nitride layer provided on the diamond layer; a silicon oxide layer provided on the alumina nitride layer; and a pair of electrodes provided between the alumina nitride layer and the silicon oxide layer, the electrodes applying a voltage to the alumina nitride layer. If a thickness of the alumina nitride layer is represented by $H_1$, a thickness of the silicon oxide layer is represented by $H_2$, a wavelength of a surface acoustic wave is represented by $\lambda$, x is defined as $x=2\pi H_1/\lambda$, and y is defined as $y=2\pi H_2/\lambda$, (x, y) meets all of the following formulas 13 to 16. That is, the formula 13 is $y \leq -0.889 \times x+6.556$; the formula 14 is $y \leq 0.333 \times x+2.767$; the formula 15 is $y \geq -0.700 \times x+3.800$; and the formula 16 is $y \geq 0.300 \times x+1.800$.

By adopting the above-mentioned configuration, a surface acoustic wave element having good electrical characteristics is obtained as in second order vibration mode of Sezawa waves. Specifically, the phase velocity Vp in fifth order vibration mode of Sezawa waves was 9000 m/s or more, so the surface acoustic wave element is allowed to increase the frequency. Also, the electromechanical coupling coefficient $K^2$ was 0.1% or more, so the efficiency of conversion between an electrical signal and a surface acoustic wave is maintained. Also, the thicknesses of the alumina nitride layer and silicon oxide layer may be selected from a range where the electromechanical coupling coefficient $K^2$ is 0.3% or more. Thus, the conversion efficiency is improved. Also, the variation rate of the frequency of surface acoustic waves in the temperature range of −45 to 85° C. fell within a range of ±2000 ppm. These will be described in detail in the DESCRIPTION OF EXEMPLARY EMBODIMENT section.

Also, the reflection coefficient becomes smaller than that in second order vibration mode of Sezawa waves and that in third order vibration mode of Sezawa waves. Thus, surface acoustic waves are efficiently generated. Also, since the reflection coefficient becomes smaller, the reflection coefficient becomes insensitive to the thickness of the electrodes and the like. Therefore, the tolerance for manufacturing variations is increased so that variations in characteristics of multiple surface acoustic wave elements are reduced.

As seen, by adopting the above-mentioned configuration, a surface acoustic wave element that is allowed to increase the frequency and has good weather resistance and electrical characteristics is obtained. Therefore, if the surface acoustic wave element according to the third aspect of the invention is used in a bandpass filter or a reference clock source using fifth order vibration mode of Sezawa waves, an extremely high-performance device is obtained.

In the surface acoustic wave element according to the first aspect of the invention, if a thickness of the electrodes is represented by $H_3$ and a value Z is defined as $Z=2\pi H_3/\lambda$, Z is preferably equal to or less than 0.35.

By adopting the above-mentioned configuration, the reflection coefficient of surface acoustic waves at the edges of the electrodes becomes less than 15%. Thus, losses of the surface acoustic waves due to refection thereof at the edges of the electrodes are reduced to a negligible level. Also, the thickness of the electrodes relative to that of the alumina nitride layer or that of the silicon oxide layer is reduced to a level that has little influence on the characteristics of the surface acoustic wave element.

BRIEF DESCRIPTION OF THE DRAWINGS

The invention will be described with reference to the accompanying drawings, wherein like reference numerals represent like elements.

FIG. 9 is a table showing comparisons among characteristics of working examples 2 to 4.

DESCRIPTION OF EXEMPLARY EMBODIMENTS

Figure 1A:
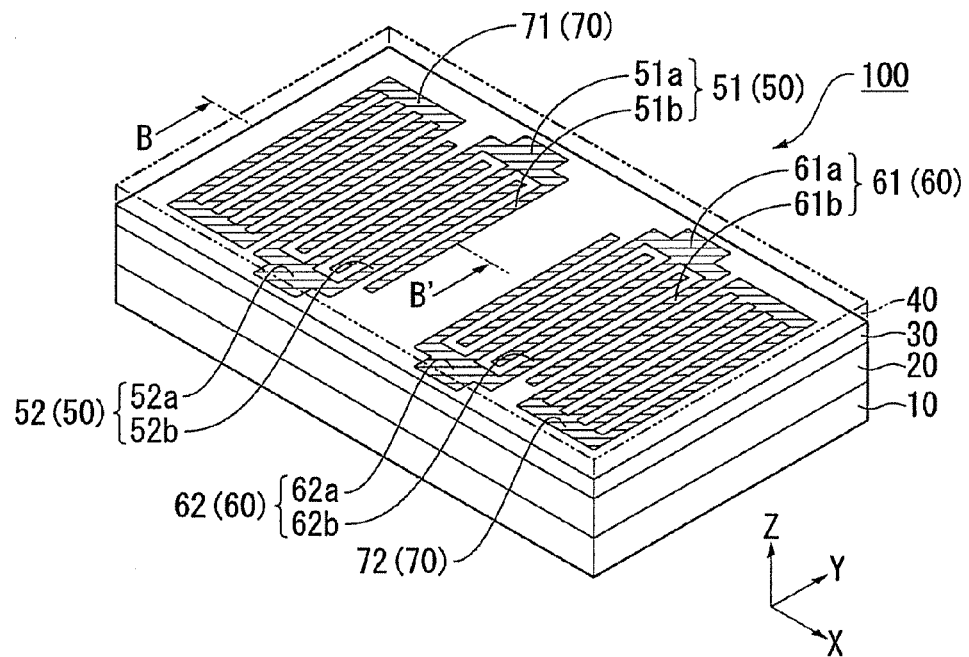
FIG. 1A is a schematic perspective view of a SAW element according to a first embodiment of the invention.

Now, embodiments of the invention will be described. However, the technical scope of the invention is not limited to the following embodiments. While various structures will be shown using the drawings in the following description, the sizes or scales of the structures may be shown in the drawings in a manner different from those of actual structures so as to clarify the features of the structures.

Figure 1B:
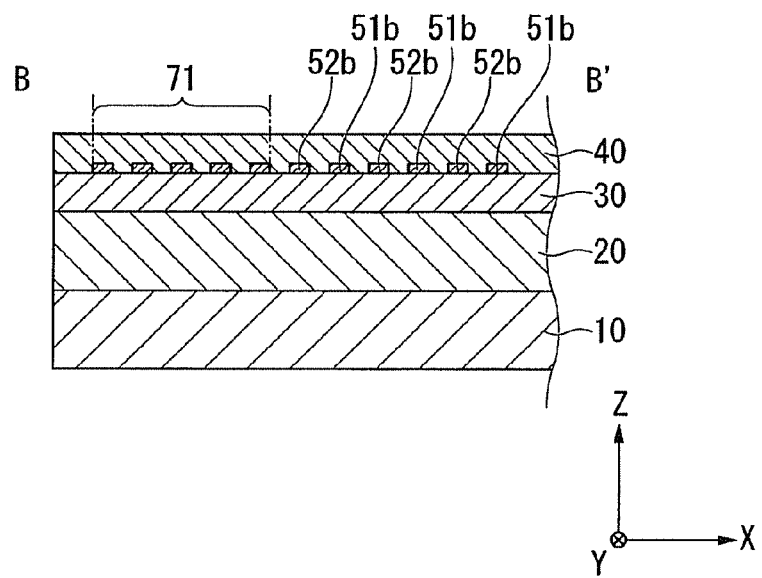
FIG. 1B is a sectional view of FIG. 1A.

FIG. 1A is a perspective schematic view showing a configuration of a surface acoustic wave (hereafter referred to as "SAW") element 100 according to a first embodiment of the invention and FIG. 1B is a sectional view as viewed from the direction of arrows B-B' of FIG. 1A. The SAW element 100 according to this embodiment is a transversal SAW filter. As shown in FIG. 1A, the SAW element 100 includes a diamond layer 20 provided on a substrate 10, an aluminum nitride layer 30 provided on the diamond layer 20, and a silicon oxide layer 40 provided on the aluminum nitride layer 30.

A pair of grating electrodes 71 and 72 are provided between the aluminum nitride layer 30 and silicon oxide layer 40. The pair of grating electrodes 71 and 72 form a reflector 70. A pair of interdigital transducers (hereafter referred to as "IDTs") 50 and 60 are provided between the pair of grating electrodes 71 and 72. In this embodiment, the IDT 50 functions as an electrical signal input section and the IDT 60 functions as an electrical signal output section.

Hereafter, the positional relations among the components will be described on the basis of an XYZ orthogonal coordinate system shown in FIG. 1A. Assume that in the XYZ orthogonal coordinate system, the arrangement direction of the pair of IDTs 50 and 60 among the surface directions of the SAW element 100 is an X direction, the direction orthogonal to the X direction is a Y direction, and the thickness direction orthogonal to the surface directions of the SAW element 100 is a Z direction. In the SAW element 100, SAWs propagating from the IDT 50 toward the IDT 60 (along the X direction) are taken out as electrical signals. The pair of grating electrodes 71 and 72 are disposed in a manner interposing the IDTs 50 and 60 in the X direction.

While the substrate 10 according to this embodiment is made of silicon, the substrate may be made of a semiconductor material other than silicon, a glass material, a ceramic material, or a resin material such as a polyimide or a polycarbonate. Also, the substrate 10 may be omitted by causing the diamond layer 20 to function as the substrate 10.

The diamond layer 20 functions as a propagation medium through which SAWs propagate. The diamond layer 20 may be any of a monocrystal one, a polycrystalline one, an amorphous one, and one made of a diamond-like carbon (DLC). A DLC is a composition of carbon and hydrogen, and the hydrogen has a smaller composition ratio. The features of a DLC include amorphousness, hardness higher than typical metals, an insulative property, and translucency.

In order to prevent the vibration range of SAWs from extending over the substrate 10, it is preferable to set the thickness of the diamond layer 20 to twice or more the amplitude of SAWs. As the thickness of the diamond layer 20 is increased, the phase velocity of SAWs is increased. However, even if the thickness is increased beyond a thickness that can prevent transmission of SAWs to the substrate 10, the phase velocity will be almost the same.

The aluminum nitride layer 30 is made of aluminum nitride, which is a piezoelectric material. When a voltage waveform is applied to the aluminum nitride layer 30 by the IDT 50, a distortion occurs on the aluminum nitride layer 30, generating SAWs corresponding to the voltage waveform. The thickness of the aluminum nitride layer 30 is selected from a range that meets a predetermined relation with the thickness of the silicon oxide layer 40. This will be described in detail later.

The IDT 50 includes a pair of interdigital transducers 51 and 52. The interdigital transducer 51 includes multiple branches 51b and a trunk 51a commonly provided for the branches 51b. While three branches 51b are shown in FIGS. 1A and B, a great number (e.g., 150, therefore, a total of 300 for the interdigital transducers 51 and 52) of branches are provided actually.

The branches 51b extend in a direction (Y direction) orthogonal to the arrangement direction (X direction) of the IDTs 50 and 60. The branches 51b are parallel with one another and are arranged at equal intervals in the X direction. The trunk 51a is connected to one end of each of the branches 51b. The trunk 51a is electrically connected to an electrical signal source and functions as an input electrode pad of the SAW element 100. The trunk 51a and branches 51b are both made of a conductive material and, in this embodiment, are integrally formed.

If the thickness of the interdigital transducer 51 is represented by $H_3$ and the wavelength of SAWs in zeroth order vibration mode (Rayleigh wave) is represented by $\lambda$, it is preferable to meet $Z=2\pi H_3/\lambda \leq 0.35$. If Z exceeds 0.35, the reflection coefficient of SAWs that enter the branches 51b and 52b will exceed 15%. Thus, losses of SAWs will be non-negligible. Also, if the above-mentioned range is met, the interdigital transducer 51 becomes sufficiently thinner than the aluminum nitride layer 30 and silicon oxide layer 40. This reduces the influence of the interdigital transducer 51 upon the characteristics of the SAW element to a negligible level. In this case, the characteristics of the SAW element refer to the electromechanical coupling coefficient $K^2$ [%], phase velocity $V_p$ [m/s], and temperature coefficient TCF [ppm/° C.].

The interdigital transducer 52 takes the same shape as that of the interdigital transducer 51 and includes a trunk 52a and multiple branches 52b. The trunk 51a is disposed on a first side (positive Y direction side) interposing the branches 51b and branches 51b in the Y direction, and the trunk 52a is disposed on a second side (negative Y direction side). The branches 51b and branches 52b are alternately arranged at equal intervals in the X direction.

When an electrical signal is inputted into the IDT 50, a voltage waveform corresponding to the electrical signal is applied between the branches 51b and branches 52b. Thus, SAWs are generated. For the interdigital transducers 51 and 52 according to this embodiment where the branches 51b and 52b are alternately arranged, the wavelength $\lambda$ of a generated SAW is represented by $\lambda=4d$, where d is the interval between each branch 51b and an adjacent branch 52b.

The IDT 60 takes the same shape as that of the IDT 50 and includes interdigital transducers 61 and 62. The interdigital transducer 61 includes a trunk 61a and multiple branches 61b and the interdigital transducer 62 includes a trunk 62a and multiple branches 62b. When SAWs enter the IDT 60, a potential difference occurs between the branches 61 and branches 62b in a manner corresponding to a distortion of the aluminum nitride layer 30 caused by vibrations of the SAWs. This potential difference causes the IDT 60 to output an electrical signal.

A grating electrode 71 reflects SAWs propagating from the IDT 50 toward the grating electrode 71 so that the SAWs propagate toward the IDT 60. The grating electrode 71 includes multiple zonal portions extending in a direction identical to the direction of the branches 51b and branches 52b. The zonal portions are arranged in parallel with one another at equal intervals. While the five zonal portions are shown in FIGS. 1A and B, a great number (e.g., 200) of zonal portions are provided actually.

A grating electrode 72 reflects SAWs propagating from the IDT 60 toward the grating electrode 72 so that the SAWs propagate toward the IDT 50. The grating electrodes 71 and 72 form the reflector 70. SAWs reciprocate within the reflector 70.

The silicon oxide layer 40 is provided in a manner covering the aluminum nitride layer 30, IDTs 50 and 60, and reflector 70. Generally, in the temperature range (for example, −45° to 85° C.) of the operating environment of a SAW element, a diamond film and an aluminum nitride film soften with a temperature increase, while a silicon oxide film hardens with a temperature increase. In the whole multilayer body including the diamond layer 20, aluminum nitride layer 30, and silicon oxide layer 40, the influence of softening of the layers 20 and 30 and the influence of hardening of the layer 40 cancel each other. Thus, variations in frequency due to temperature variations are restrained. The allowable range of the rate of frequency variations to temperature variations in the above-mentioned temperature range is, for example, ±1000 ppm or so. Therefore, the allowable range of the temperature coefficient TCF [ppm/° C.] of the frequency variation rate is, for example, approximately $-15<TCF<15$.

Since the thickness of the silicon oxide layer 40 is selected from a range that meets a predetermined relation with the thickness of the aluminum nitride layer 30, TCF falls within the above-mentioned allowable range. This will be described in detail later.

Incidentally, a SAW element using a zinc oxide film as a piezoelectric material layer has been proposed. In general, a zinc oxide film has a Young's modulus lower than that of an electrode, so SAWs entering from the zinc oxide film to the electrode along the surface direction are easily reflected at edges of the electrodes. Then, the SAWs reflected at the electrode edge interfere with one another thereby increasing losses of the SAWs. In order to reduce such SAW losses, it is considered to reduce the interference between SAWs or reduce the reflection coefficient at the electrode edges.

As a method for reducing the interference between SAWs, it is considered to adjust the shape of the interdigital transducers (for example, the number or disposition of branches). However, if this method is used, the interdigital transducers are formed into a shape that is not suitable for generating SAWs. As a method for reducing the reflection coefficient at the electrode edge, it is considered to reduce the thicknesses of the electrodes. However, if this method is used, the electrodes increase resistance thereof, degrading the electrical characteristics of the SAW element. In particular, if this method is used with respect to a SAW element for use in a small device such as a cell phone, the drive voltage is increased. This makes it difficult to configure a device.

Also, as a method for reducing the reflection coefficient, it is considered to form a piezoelectric material layer using a film (for example, aluminum nitride film) having a smaller difference in Young's modulus between the film and the electrodes smaller than the difference between a zinc oxide film and the electrodes. However, for the following reasons, much effort is required to form a piezoelectric material layer using aluminum nitride as well as to obtain a SAW element having desired characteristics.

If a piezoelectric material layer is formed using a zinc oxide film, it is easy to design a piezoelectric material film with a thickness corresponding to desired characteristics of the SAW element. This is because the relationship between the thickness of a zinc oxide film and characteristics of a SAW element is known. On the other hand, if a silicon oxide film is formed as a temperature compensation layer for the purpose of reducing the temperature dependency in a case where a piezoelectric material layer is formed using an alumina oxide film, it is very difficult to obtain a SAW element having desired characteristics. This is because the influence of the thicknesses of the alumina oxide film and silicon oxide film upon the characteristics of the SAW element is unknown.

The inventors improved and developed a numerical model based on the finite element method (FEM) and then performed a numerical simulation while changing the thicknesses of the alumina nitride layer and silicon oxide layer. Also, the inventors evaluated the accuracy of the numerical simulation by performing a comparative experiment and then confirmed that the accuracy of the simulation is sufficient. Hereafter, the result of the numerical simulation will be described.

Figure 2A:
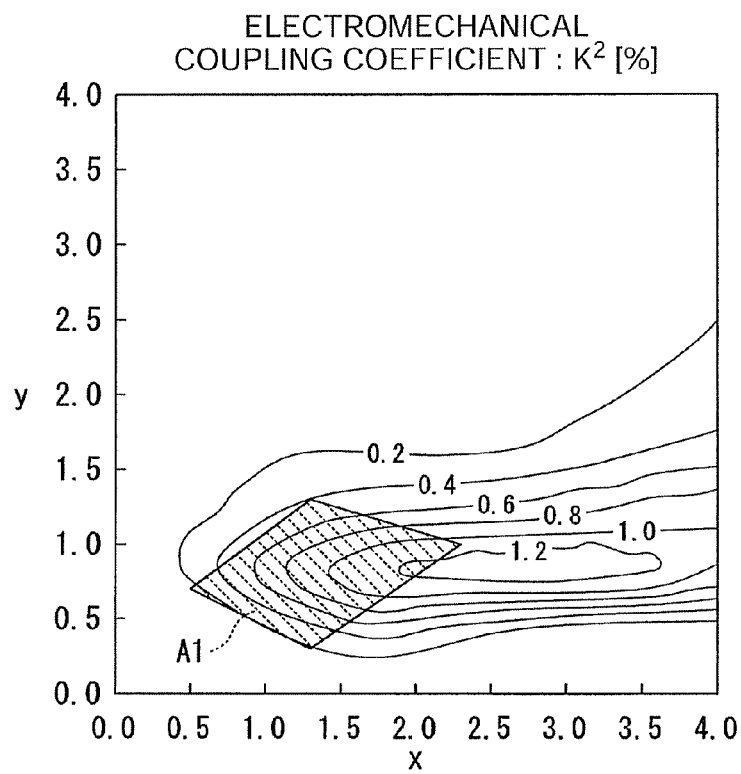
FIGS. 2A and 2B are graphs showing characteristics of second order vibration mode.
Figure 2B:
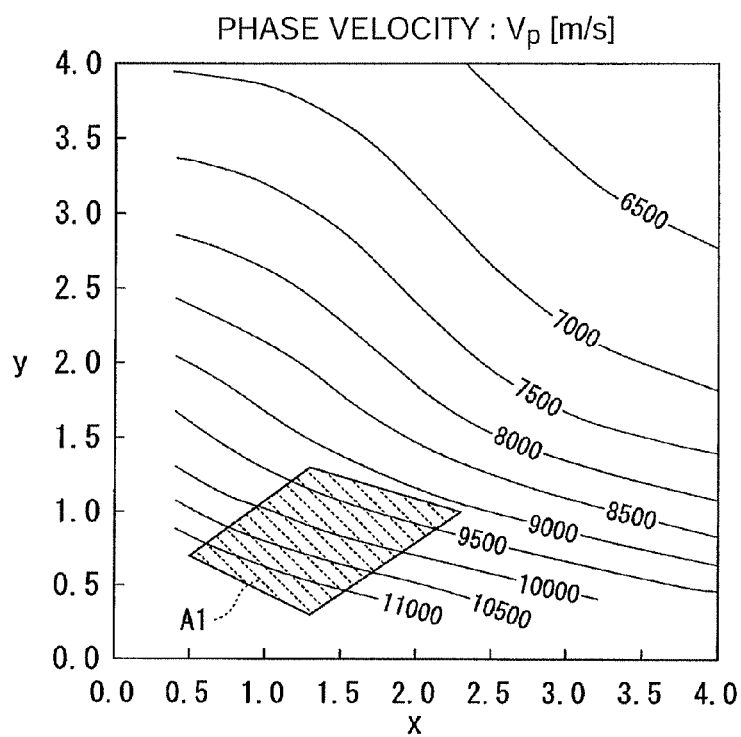

FIG. 2A is a contour map showing the electromechanical coupling coefficient $K^2$ [%] with respect to the thicknesses of the alumina nitride layer and silicon oxide layer in second order vibration mode of Sezawa waves. FIG. 2B is a contour map showing the phase velocity $V_p$ [m/s] of SAWs with respect to the thicknesses of the alumina nitride layer and silicon oxide layer in second order vibration mode of Sezawa waves. In FIGS. 2A and 2B, the lateral axis x represents a value obtained by non-dimensionalizing a thickness $H_1$ of the alumina nitride layer using the wavelength $\lambda$ of SAWs in zeroth order vibration mode and is obtained by $x=2\pi H_1/\lambda$. The longitudinal axis y is a value obtained by non-dimensionalizing a thickness $H_2$ of the silicon oxide layer 40 using the wavelength $\lambda$ and is obtained by $y=2\pi H_2/\lambda$.

The SAW element according to this embodiment is an element using SAWs in second order vibration mode of Sezawa waves. The thickness $H_1$ of the alumina nitride layer and the thickness $H_2$ of the silicon oxide layer are selected so that (x, y) falls within areas A1, including the perimeters thereof, shown in FIGS. 2A and 2B. The areas A1 is areas meeting all of Formulas 1 to 4 below.

$y \leq 0.750 \times x + 0.325$   Formula 1

$y \leq -0.300 \times x + 1.690$   Formula 2

$y \geq -0.500 \times x + 0.950$   Formula 3

$y \geq 0.700 \times x - 0.610$   Formula 4

As shown in FIG. 2A, the values of (x, y) of the SAW element according to this embodiment fall within the area A1, so $K^2$ is approximately 0.2 or more. Therefore, for the following reasons, the SAW element is a SAW element that is allowed to form a good device.

For a SAW element for increasing a passband, such as one used in a bandpass filter, it is advantageous to set a larger K1 in order to increase the efficiency of conversion between an electrical signal and a SAW. For example, if a SAW element is used in a narrow-band filer, it is said that $K^2$ is preferably approximately 0.15 to 0.7. In particular, if $K^2$ is approximately 0.2 or more within this range, the conversion efficiency is maintained.

For a SAW element for narrowing the passband, such as a SAW element used as a resonator, it is advantageous to set a smaller $K^2$ in order to increase the Q value. If a smaller K2 is set, the strength of SAWs is increased by increasing the respective numbers of branches 51b, 52b, 61b, and 62b of the IDTs 60 and 70. However, the numbers of branches 51b, 52b, 61b, and 62b each have an upper limit. By setting $K^2$ to approximately 0.2 or more, the strength of SAWs is ensured. Incidentally, when SAWs suffer large propagation losses in a propagation medium, the element characteristics of the element are degraded. However, if a multilayer body including an alumina nitride layer and the like is used as a propagation medium, the characteristics of the element are maintained by setting $K^2$ to approximately 0.2 or more.

As shown in FIG. 2B, the values of (x, y) of the SAW element according to this embodiment fall within the area A1, so $V_p$ is approximately 9000 or more. A realistic minimum interval between the branches 51b and branches 52b of the interdigital transducers 51 and 52 and one between the branches 61b and branches 62b of the interdigital transducers 61 and 62 are both 0.4 μm. This is a value used when forming the interdigital transducers 51 and 52 using photolithography using an i-line stepper. In this case, the wavelength $\lambda$ of SAWs becomes approximately 1.6 μm and $V_p$ becomes approximately 9000 or more. Thus, the operating frequency f of the SAW element becomes approximately 5.7 GHz or more. As seen, the SAW element according to this embodiment can corresponds to, for example, 5.7 GHz, which is a frequency assigned to wireless LANs, and is a SAW element that can form a good device. As is understood from FIG. 2B, it is also possible to select (x, y) so that $V_p$ is approximately 11500 while $K^2$ is approximately 0.2 or more. In this case, the operating frequency of the SAW element becomes approximately 7.2 GHz. As seen, the SAW element according to this embodiment is allowed to significantly increase the operating frequency. Also, it is possible to increase the interval between each branch 51b and an adjacent branch 52b and that between each branch 61b and an adjacent branch 62b while maintaining the operating frequency. This reduces the manufacturing cost or prevents degradation of the electrical characteristics due to miniaturization of the IDTs 60 and 70.

Also, the inventors examined the rate (temperature coefficient TCF) of characteristic changes to temperature variations. As a result, the inventors found that if Formula 9 below is met, TCF=0 and that if both Formulas 10 and 11 are met, −15<TCF<15. The area A1 is a range meeting both Formulas 10 and 11; therefore, −15<TCF<15. Thus, in the temperature range of the operating environment, the variation rate of the frequency of SAWs falls within ±1000 ppm. Therefore, the SAW element stably operates against temperature variations.

$y = 0.552 \times x$   Formula 9

$y \leq 0.552 \times x + 0.690$   Formula 10

$y \geq 0.552 \times x - 0.690$   Formula 11

Figure 3A:
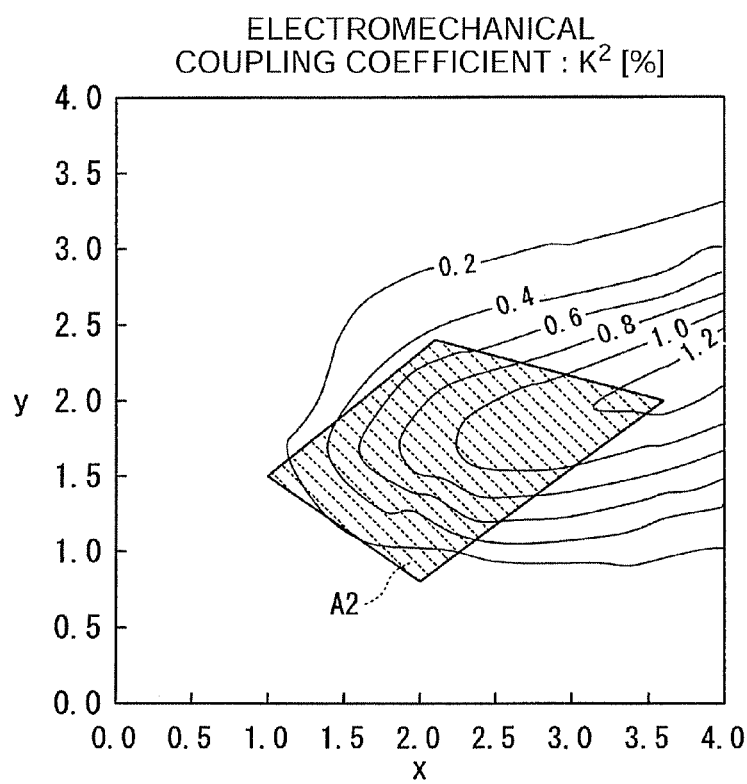
FIGS. 3A and 3B are graphs showing characteristics of third order vibration mode.
Figure 3B:
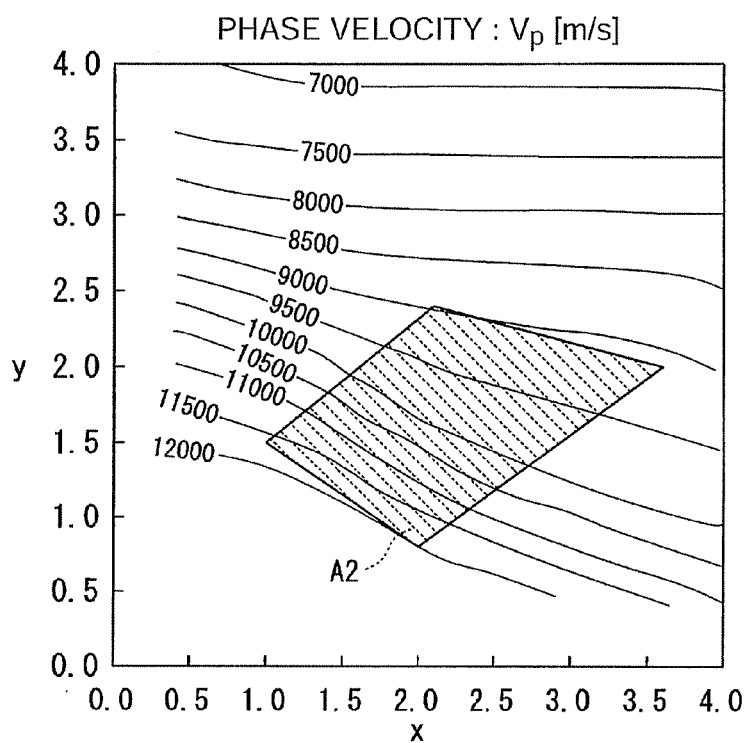

FIG. 3A is a contour map showing the electromechanical coupling coefficient $K^2$ [%] with respect to the thickness of the alumina nitride layer and the thickness of the silicon oxide layer in third order vibration mode of Sezawa waves. FIG. 3B is a contour map showing the phase velocity $V_p$ [m/s] of SAWs with respect to the thickness of the alumina nitride layer and the thickness of the silicon oxide layer in third order vibration mode of Sezawa waves. In FIGS. 3A and 3B, the lateral axis x is a value obtained by non-dimensionalizing the thickness $H_1$ of the alumina nitride layer using the wavelength $\lambda$ of SAWs in zeroth order vibration mode and is represented by $x=2\pi H_1/\lambda$. The longitudinal axis y is a value obtained by non-dimensionalizing the thickness $H_2$ of the silicon oxide layer using the wavelength $\lambda$ and is obtained by $y=2\pi H_2/\lambda$.

A SAW element according to a second embodiment of the invention is an element using SAWs in third order vibration mode of Sezawa waves. The thickness $H_1$ of the alumina nitride layer and the thickness $H_2$ of the silicon oxide layer are selected so that (x, y) falls within areas A2, including the perimeters thereof, shown in FIGS. 3A and 3B. The areas A2 are both an area meeting all of Formulas 5 to 8 below.

$y \leq 0.818 \times x + 0.682$   Formula 5

$y \leq -0.266 \times x + 2.960$   Formula 6

$y \geq -0.700 \times x + 2.200$   Formula 7

$y \geq 0.750 \times x - 0.700$   Formula 8

As shown in FIGS. 3A and 3B, (x, y) of the SAW element according to the other embodiment falls within the areas A2, so $K^2$ is approximately 0.2 or more and $V_P$ is approximately 9000 or more. Thus, as with the SAW element using SAWs in second order vibration mode of Sezawa waves, the SAW element is allowed to significantly increase the operating frequency while maintaining the conversion efficiency, the strength of SAWs, and the like. Also, the areas A2 are both a range meeting both the above-mentioned Formulas 10 and 11. Thus, the SAW element stably operates against temperature variations. Also, propagation losses of SAWs in third order vibration mode in the SAW element selected from the area A2 are smaller than propagation losses of SAWs in second order vibration mode in the SAW element selected from the area A1.

Figure 4A:
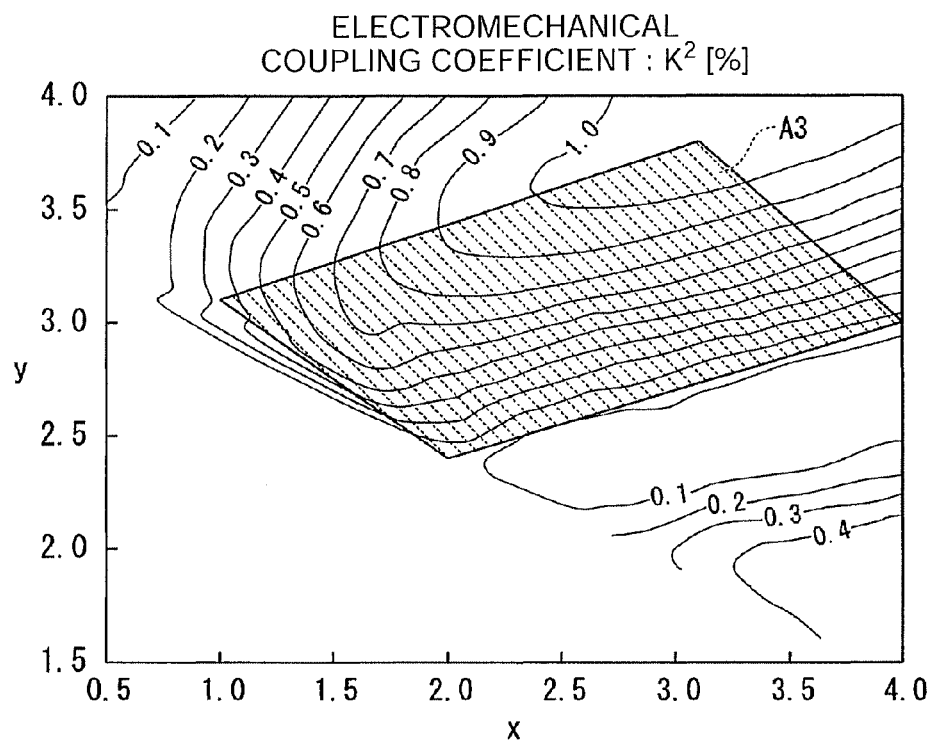
FIGS. 4A and 4B are graphs showing characteristics of fifth order vibration mode.
Figure 4B:
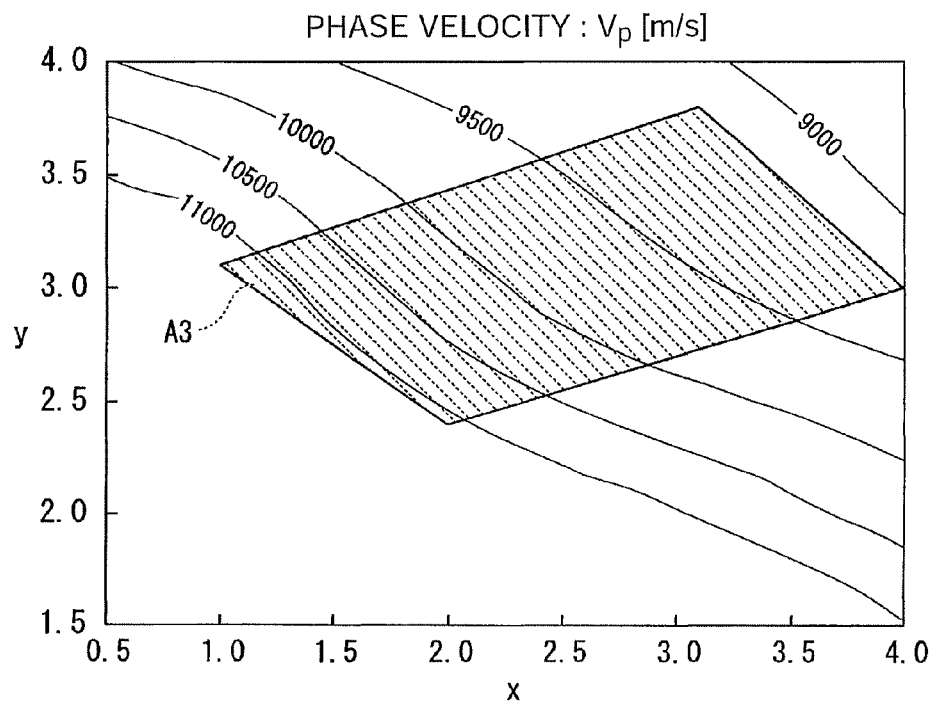

FIG. 4A is a contour map showing the electromechanical coupling coefficient $K^2$ [%] with respect to the thicknesses of the alumina nitride layer and silicon oxide layer in fifth order vibration mode of Sezawa waves. FIG. 4B is a contour map showing the phase velocity $V_p$ [m/s] of SAWs with respect to the thicknesses of the alumina nitride layer and silicon oxide layer in fifth order vibration mode of Sezawa waves. In FIGS. A and 4B, the lateral axis x represents a value obtained by non-dimensionalizing the thickness $H_1$ of the alumina nitride layer using the wavelength λ of SAWs in zeroth order vibration mode and is obtained by $x=2\pi H_1/\lambda$. The longitudinal axis y is a value obtained by non-dimensionalizing the thickness $H_2$ of the silicon oxide layer using the wavelength λ and is obtained by $y=2\pi H_2/\lambda$.

A SAW element according to a third embodiment of the invention is an element using SAWs in fifth order vibration mode of Sezawa waves. The thickness $H_1$ of the alumina nitride layer and the thickness $H_2$ of the silicon oxide layer are selected so that (x, y) falls within areas A3, including the perimeters thereof, shown in FIGS. 4A and 4B. The areas A3 are both an area meeting all of Formulas 13 to 16 below.

$$y \leq -0.889 \times x + 6.556 \quad \text{Formula 13}$$

$$y \leq 0.333 \times x + 2.767 \quad \text{Formula 14}$$

$$y \geq -0.700 \times x + 3.800 \quad \text{Formula 15}$$

$$y \geq 0.300 \times x + 1.800 \quad \text{Formula 16}$$

As shown in FIGS. 4A and 4B, (x, y) of the SAW element according to the third embodiment falls within the areas A3, so $K^2$ is approximately 0.15 or more and $V_P$ is 9000 or more. Thus, as with the SAW element using SAWs in second order vibration mode of Sezawa waves, the SAW element is allowed to significantly increase the operating frequency while maintaining the conversion efficiency, the strength of SAWs, and the like. Also, since the values of (x, y) fall within the areas A3, the frequency variation rate of SAWs falls within ±2000 ppm in the temperature range of the operating environment.

As seen, the SAW element where the values of (x, y) are selected from one of the areas A1 and A2 is more advantageous than the SAW element where the values of (x, y) are selected from the areas A3, in terms of the temperature characteristic. On the other hand, if the values of (x, y) are selected from the areas A3, the reflection coefficient at the electrodes of SAWs in fifth order vibration mode is significantly smaller than any of the reflection coefficient at the electrodes of SAWs in second order vibration mode in a case where the values of (x, y) are selected from the areas A1 and the reflection coefficient at the electrodes of SAWs in third order vibration mode in a case where the values of (x, y) are selected from the areas A2. Therefore, the reflection coefficient becomes insensitive to the thickness or width of the branches of the interdigital transducers so that a margin for manufacturing variations among electrodes is increased. Therefore, the tolerance for manufacturing variations among surface acoustic wave elements is increased so that characteristic variations among multiple surface acoustic wave elements are reduced. Also, the number of the branches of each interdigital transducer and the freedom degree of disposition of the branches are increased. Therefore, it is easy to increase the strength of SAWs generated between the interdigital transducers.

Also, if the values of (x, y) are selected from the areas A3, propagation losses in fifth order vibration mode become smaller than ones in second order vibration mode in a case where the values of (x, y) are selected from the areas A1. This makes it possible to form a highly efficient SAW element.

Working Example 1

Next, a manufacturing method and characteristics of a SAW element according to a working example 1 will be described. FIG. 6A is a schematic plan view showing an outline configuration of a SAW element 200 according to this working example and FIG. 5B is a sectional view as seen from the direction of lines C-C'. While the SAW element 200 is different from the SAW element 100 according to the first embodiment in that the SAW element 200 is one-port resonator, the SAW element 200 has the same sectional structure as that of the SAW element 100.

Figure 5A:
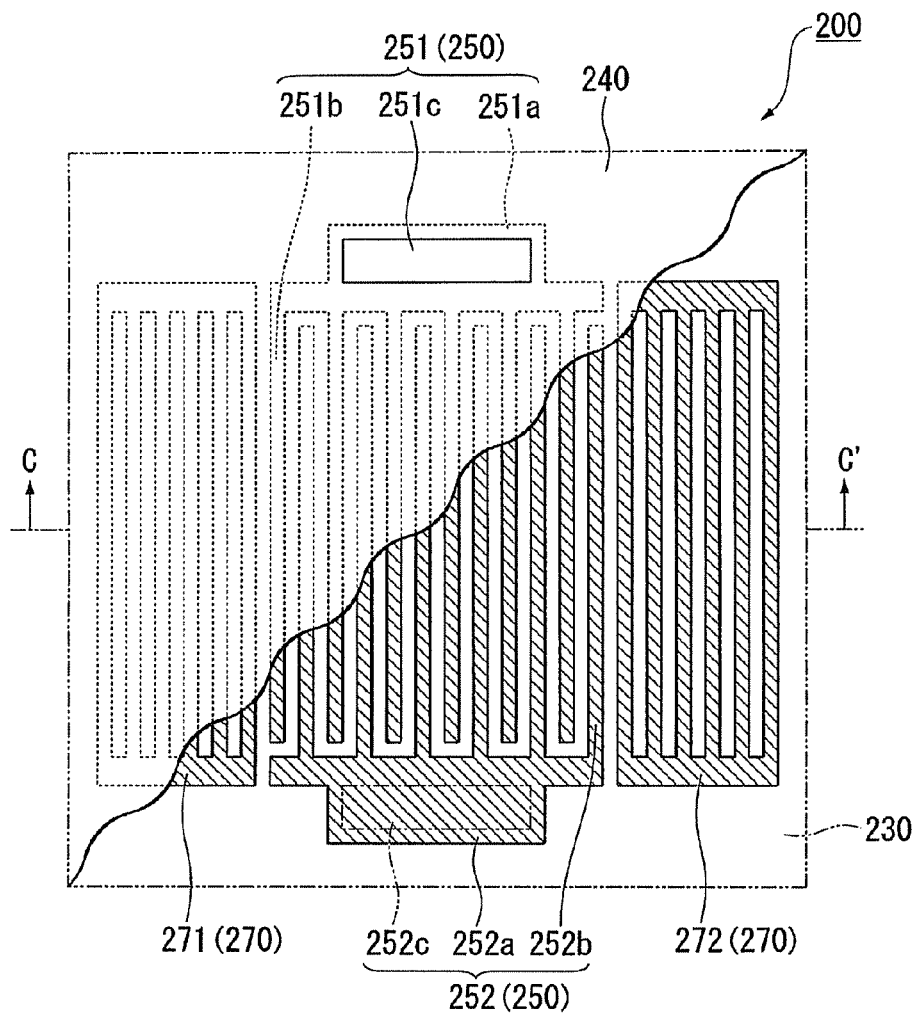
FIG. 5A is a schematic plan view of a SAW element according to a working example 1.
Figure 5B:
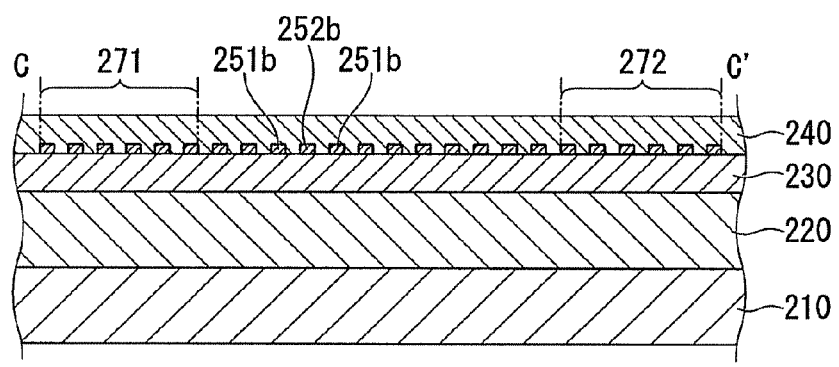
FIG. 5B is a sectional view of FIG. 5A.

As shown in FIGS. 5A and 5B, the SAW element 200 includes an aluminum nitride layer 230 and a silicon oxide layer 240 provided on the aluminum nitride layer 230. An IDT 250 and a reflector 270 are provided between the aluminum nitride layer 230 and silicon oxide layer 240. The IDT 250 includes a pair of interdigital transducers 251 and 252. The interdigital transducer 251 includes a trunk 251a and multiple branches 251b and the interdigital transducer 252 includes a trunk 252a and multiple branches 252b. The reflector 270 includes a pair of grating electrodes 271 and 272. The grating electrodes 271 and 272 are disposed in a direction orthogonal to the direction in which the branches 251b and branches 252b extend in a manner interposing the interdigital transducers 251 and 252. The silicon oxide layer 240 has openings for exposing the trunks 251a and 252a. By increasing the thicknesses of portions of the trunks 251a and 252a exposed in the openings, the portions serve as electrode pads 251c and 252c, respectively. The electrode pads 251c and 252c are electrically connected to lead terminals (not shown).

In order to manufacture the SAW element 200 as described above, first, a diamond layer 220 with a thickness of 10 μm was formed on a silicon substrate 210 by CVD (chemical vapor deposition). As methods for manufacturing the diamond layer 220, known methods, such as PVD (physical vapor deposition) and hot-filament, as well as CVD may be used.

Next, the aluminum nitride layer 230 with a thickness of 750 nm was formed on the diamond layer 220. As methods for forming the aluminum nitride layer 230, known methods such as heat deposition, CVD, and PVD may be used. In order to obtain a good piezoelectric effect, it is preferable to form the aluminum nitride layer 230 while performing control so that C axis orientation prevails. The C axis orientation refers to an orientation where a (001) surface of the aluminum nitride film is parallel with the surface direction of the silicon substrate 210.

Next, a metal film was formed on the aluminum nitride layer 230. The metal film would become the IDT 250 and reflector 270 later. A material for forming the metal film may be a known conductive material, such as aluminum (Al), gold (Au), platinum (Pt), copper (Cu), tantalum (Ta), tungsten (W), molybdenum (Mo), or an alloy using one or some of these materials as the main material. As methods for forming the metal film, known methods such as heat deposition, CVD, and PVD may be used. In this working example, an aluminum film with a thickness of 65 nm was formed as the metal film by PVD.

Next, the above-mentioned metal film was patterned by photolithography and etching so that the IDT 250 and reflector 270 were collectively formed. In this working example, the number of branches 251*b* and that of the branches 252*b* were both 150 and the interval between each branch 251*b* and an adjacent branch 252*b* was 0.9 µm. Thus, the wavelength λ in zeroth order vibration mode of generated SAWs became 3.6 µm. The length of the branches 251*b* and branches 252*b* in the extending direction thereof was fifty times the wavelength λ, that is, 180 µm. The number of gratings of each of the grating electrodes 271 and 272 of the reflector 270 was 200. The number of gratings refers to the number of the zonal portions extending in parallel with the branches 251*b* and 252*b*, of each of the grating electrodes 271 and 272.

In this working example, the thickness H3 of the electrode (IDT 250) was 65 nm and the wavelength was 3.6 µm. Since $Z=2\pi H_3/\lambda$, Z was approximately 0.11.

Next, the silicon oxide layer 240 with a thickness of 600 nm was formed in a manner covering the aluminum nitride layer 230, IDT 250, and reflector 270. As methods for forming the silicon oxide layer 240, known methods such as heat deposition, CVD, and PVD may be used. Then, openings for exposing the trunks 251*a* and 252*b* were made on the silicon oxide layer 240 by photolithography and etching. By increasing the thicknesses of portions of the trunks 251*a* and 252*a* exposed in the openings, the electrode pads 251*c* and 252*c* were formed, respectively. As methods for increasing the thicknesses, known methods such as heat deposition, PVD, and plating may be used. The material for the trunks 251*c* and 252*c* may be different from that of the electrode pads 251*c* and 252*c*. Then, for example, lead terminals to serve as input/output terminals were provided for the electrode pads 251*c* and 252*c*. In this way, the SAW element 200 was obtained.

Figure 6:
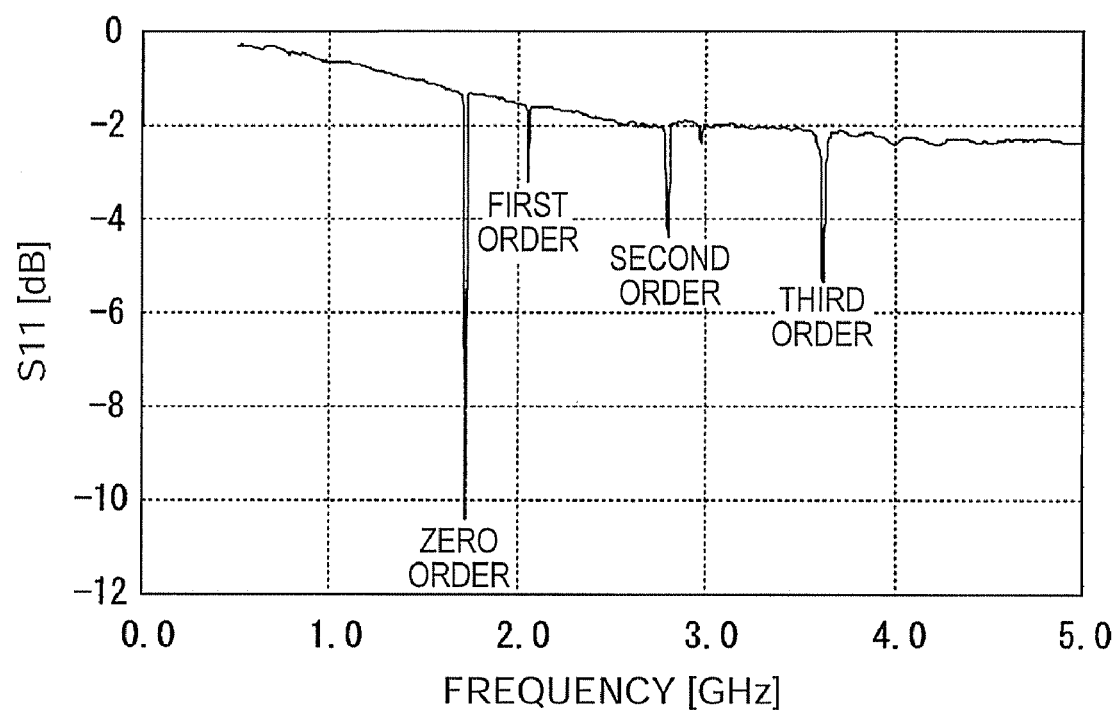
FIG. 6 is a graph showing an S11 characteristic of the SAW element according to the working example 1.

Next, characteristics of the SAW element 200 will be described with reference to FIG. 6 and FIGS. 7A and 7B. In order to examine characteristics of the SAW element 200, first, a high-frequency signal was applied to an input terminal of the SAW element 200 using a network analyzer and then the high-frequency signal taken out from an output terminal thereof was measured. Thus, an input-terminal-to-output-terminal pass characteristic was obtained. As a result, an S11 characteristic of the SAW element 200 was obtained. From this graph, it is understood that the phase velocity $V_p$ of SAWs was approximately 9300 m/s in second order vibration mode and approximately 11500 m/s in third order vibration mode.

In general, a SAW element is formed of a piezoelectric monocrystal substrate or formed by forming a piezoelectric, thin film on a glass substrate. For such a SAW element, the phase velocity is approximately 3000 to 7000 m/s. For the SAW element 200 according to this working example, the phase velocity is significantly increased. Therefore, the operating frequency of the SAW element 200 is significantly increased.

Figure 7A:
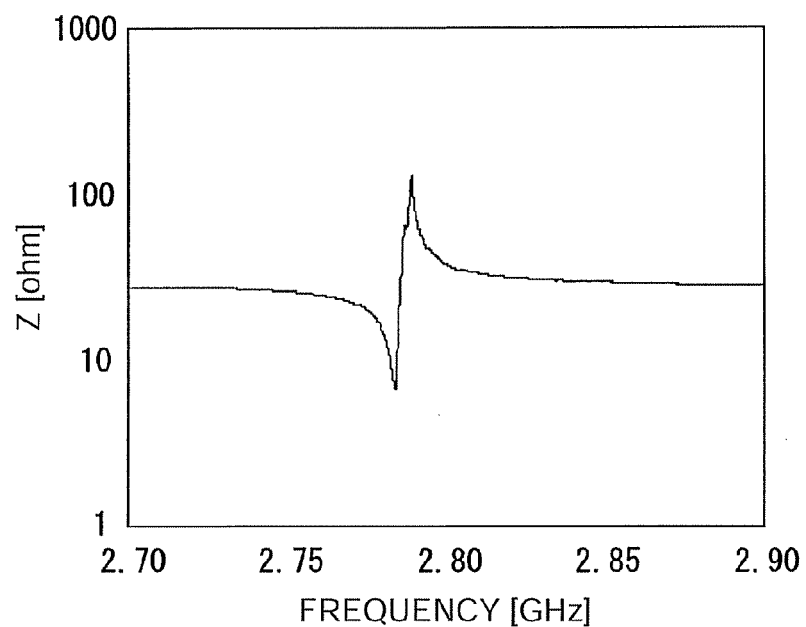
FIGS. 7A and 7B are graphs showing the S11 impedance characteristic of the working example 1.
Figure 7B:
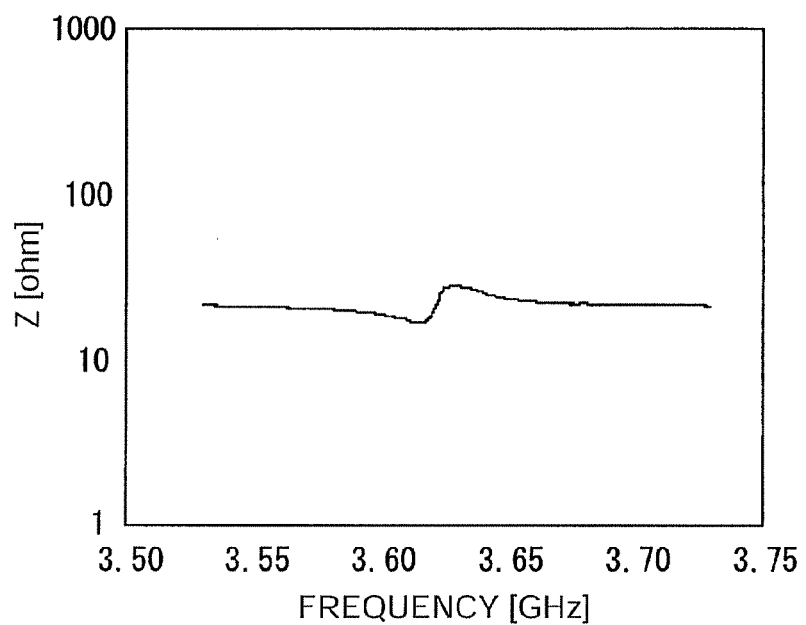

Also, from the S11 impedance characteristic in second order vibration mode shown in FIG. 7A, it is understood that a resonant frequency $f_r$ and an anti-resonant frequency $f_a$ were obtained and that the electromechanical coupling coefficient $K^2$ was approximately 0.45% in second order vibration mode. Also, from the S11 impedance characteristic in second order vibration mode shown in FIG. 7B, it is understood that the electromechanical coupling coefficient $K^2$ was approximately 0.87% in third order vibration mode. As seen, for the SAW element 200 according to this working example, the electromechanical coupling coefficient $K^2$ was kept at 0.2 or more. Therefore, the SAW element 200 can favorably function. The electromechanical coupling coefficient $K^2$ [%] in each vibration mode is calculated using Formula 12 below.

$$K^2=(\pi^2/4)\cdot(f_r/f_a)\cdot(f_a-f_r)/f_a\cdot100 \quad \text{Formula 12}$$

Also, the phase velocity was measured using the above-mentioned method under conditions where the operating ambient temperature of the SAW element 200 is −25° C., 0° C., 25° C., 50° C., or 75° C. Then, the measured values were linearly approximated so that the temperature coefficient TCF [ppm/° C.] with respect to a standardized phase velocity was calculated. As a result, the temperature coefficient TCF was approximately 6 ppm/° C. in second order vibration mode and 5 ppm/° C. in third order vibration mode. Specifically, it is understood that even when the operating ambient temperature was changed in the range of −25 to 75° C., the variation amount of the standardized phase velocity fell within a range of ±250 ppm in second order vibration mode and fell within a range of ±300 ppm in third order vibration mode.

In general, if the amount of characteristic variation in a SAW element falls within a range of ±1000 ppm at the operating ambient temperature of −45 to 85° C., the variation amount is allowable. That is, if the absolute value of the TCF of the SAW element is less than 15 ppm/° C., the TCF is allowable. For the SAW element 200 according to this working example, the TCF is significantly smaller than the tolerance thereof. Therefore, the SAW element 200 stably operates against temperature variations, that is, the SAW element 200 has good weather resistance.

Also, characteristics of the SAW element were evaluated in the above-mentioned way while changing the thicknesses of the alumina nitride layer and silicon oxide layer of the SAW element. The electromechanical coupling coefficient $K^2$ and phase velocity $V_p$ obtained from the characteristic evaluation both favorably matched the numerical simulation results shown in FIGS. 3A and 3B and FIGS. 4A and 4B. Also, for the temperature coefficient TCF, the evaluation results favorably matched the numerical simulation results.

Working Example 2

Next, characteristics of a SAW element according to a working example 2 will be described. The SAW element according to the working example 2 is two-port SAW filter and has the same configuration as that of the SAW element 100 shown in FIG. 1. While the SAW element according to the working example 2 is manufactured using the same manufacturing method as that of the working example 1, the working example 2 is different from the working example 1 in sizes of components and the like. For the SAW element according to the working example 2, the wavelength λ of SAWs was 1.6 µm, a value x ($x=2\pi H_1/\lambda$) obtained by non-dimensionalizing the thickness $H_1$ of the alumina nitride layer was 3.06, and a value y ($y=2\pi H_2/\lambda$) obtained by non-dimensionalizing the thickness $H_2$ of the silicon oxide layer was 3.14. That is, for the working example 2, the values of (x, y) were selected from the area A3.

Also, a value Z ($Z=2\pi H_3/\lambda$) obtained by non-dimensionalizing the thickness $H_3$ of the IDT was 0.26. The number of the branches of each of interdigital transducers was 50 (a total of 100 for a pair of interdigital transducers) and the size (intersecting width) in the branch disposition direction, of the intersecting portions of the branches of the pair of interdigital transducers was 30λ. A pair of grating electrodes forming a reflector each had 200 gratings.

Figure 8:
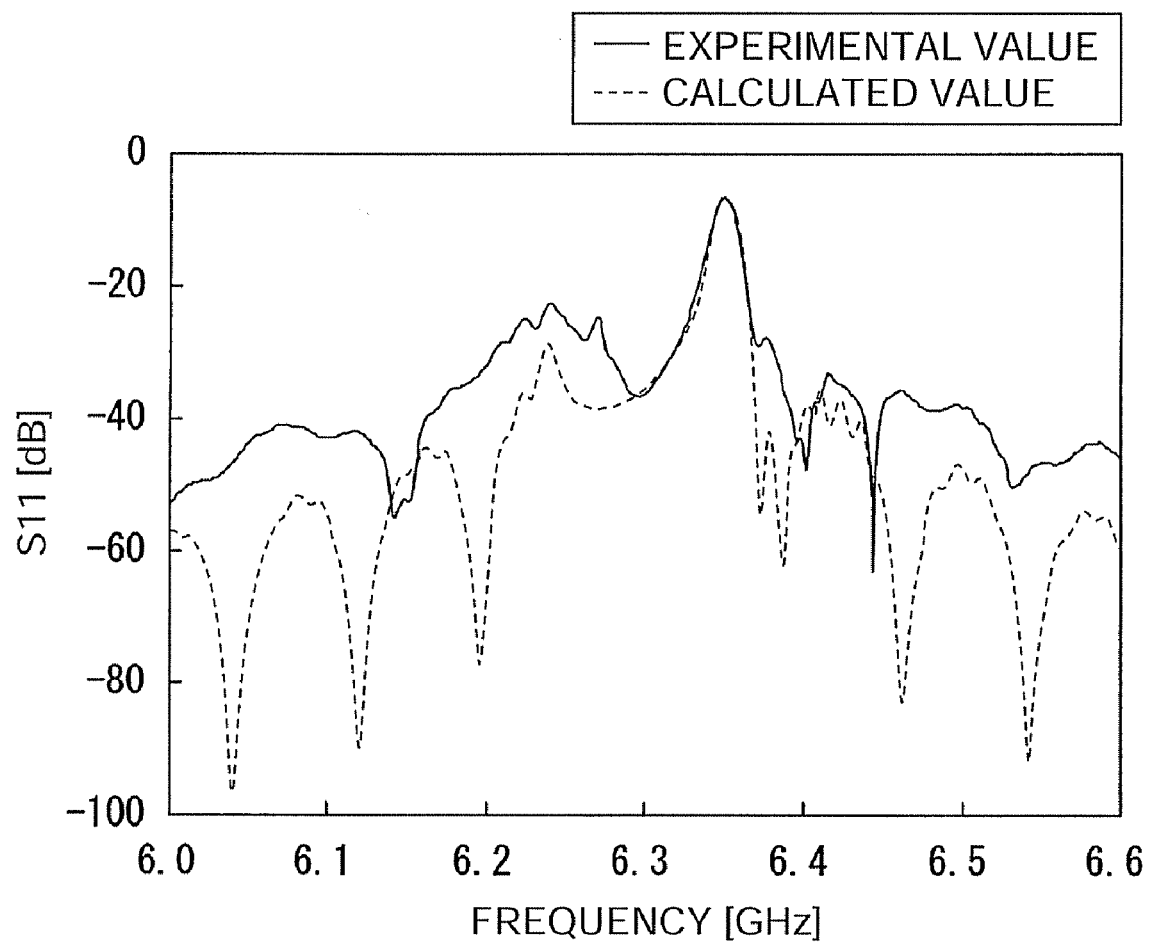
FIG. 8 is a graph showing comparisons between calculated values and experimental values with respect to an S21 characteristic.

FIG. 8 is a graph showing comparisons between calculated values and experimental values of an S21 characteristic with respect to SAWs in fifth order vibration mode generated in the SAW element according to the working example 2. The calculated values shown in FIG. 8 are values obtained from a numerical simulation, and the experimental values are values obtained by making measurements using a network analyzer. As shown in FIG. 8, the waveform of the calculated values and the waveform of the experimental values both have a peak corresponding to the center frequency around a frequency of 6.35 GHz. It is understood that the waveform of the calculated values almost completely matches the waveform of the experimental values around these peaks and therefore the center frequency can be estimated from the numerical simulation with high accuracy. Also, the phase velocity of SAWs is obtained by using the estimated center frequency and the wavelength of the SAWs. This makes it possible to estimate the phase velocity of SAWs with high accuracy by conducting a numerical simulation. For the SAW element according to the working example 2, the center frequency was approximately 6.3 GHz, the insertion loss was approximately 6.6 dB, and the Q value was approximately 450. That is, very good characteristics were shown.

FIG. 9 is Table 1 showing comparisons among measured values of characteristics of SAW elements according to working examples 2 to 4. As described above, for the SAW element according to the working example 2, the values of (x, y) of are (3.06, 3.14) selected from the area A3. For the SAW element according to the working example 3, the values of (x, y) are (1.36, 0.70) selected from the area A1. For the SAW element according to the working example 4, the values of (x, y) are (1.36, 1.05) selected from the area A2.

As shown in Table 1 of FIG. 9, the temperature coefficient was 6.0 ppm/° C. for the working example 2, −1.0 ppm/° C. for the working example 3, and 0.0 ppm/° C. for the working example 4. From these values, it is understood that for the SAW elements according to the working examples 2 to 4, the variation rate of the SAW frequency to temperature variations is extremely low and therefore these SAW elements have good weather resistance. In particular, the SAW elements according to the working examples 3 and 4 are better in weather resistance than the SAW element according to the working example 2.

The reflection coefficient was 2.0% for the working example 2, 5.5% for the working example 3, and 6.5% for the working example 4. That is, it is understood that the reflection coefficients of the SAW elements according to the working examples 2 to 4 are extremely small and losses due to reflection on the interdigital transducers have been reduced. In particular, the reflection coefficient of the SAW element according to the working example 2 is significantly smaller than those of the SAW elements according to the working example 3 and 4. That is, for the SAW element according to the working example 2, the influence of interference between SAWs reflected by the interdigital transducers is smaller than those for the other SAW elements. Therefore, the SAW element according to the working example 2 is better than the other SAW elements in that characteristic variations due to variations in thickness of the interdigital transducers are fewer. Also, the SAW element according to the working example 2 is better in that it is easy to increase the number of the branches of the interdigital transducers or change the disposition of the branches.

The propagation loss was 0.03 dB/λ for the working example 2, 0.05 dB/λ for the working example 3, and 0.02 dB/λ for the working example 4. Therefore, it is understood that the propagation losses of the SAW elements according to the working examples 2 to 4 were extremely small and therefore these SAW elements are highly efficient. In particular, the SAW elements according to the working examples 2 and 4 are better than the SAW element according to the working example 3 in that the propagation losses of the former SAW elements are smaller than that of the latter SAW element.

As described above, aluminum nitride is used as a piezoelectric material in the SAW elements according to the invention; therefore, the difference in Young' modulus between the IDT and piezoelectric material layer is smaller than that in a case where zinc oxide is used. Thus, the reflection coefficient of SAWs at the edge of the IDT is reduced. This eliminates the need to reduce the thickness of the IDT so as to reduce the reflection coefficient or the need to reduce the number of the branches of the interdigital transducers so as to reduce interference due to reflection. Thus, the electrical characteristics of each SAW element are enhanced while reducing losses of SAWs. As a result, the SAW elements show good characteristics.

Also, the phase velocity $V_p$ are increased to 9000 m/s or more, so the SAW elements are allowed to increased the frequency of SAWs (for example, to 5.7 GHz or more). Also, the electromechanical coupling coefficient $K^2$ is kept at 0.2% or more, so the SAW elements maintains the efficiency of conversion between an electrical signal and a surface acoustic wave. Also, the temperature coefficient of characteristic variations becomes less than 15 ppm/° C., so the SAW elements show good weather resistance.

As seen, the SAW elements according to the invention show good characteristics. Therefore, if any of the SAW elements according to the working examples is used in a bandpass filter, a reference clock source, or the like, an extremely high-performance device is obtained.

What is claimed is:
1. A surface acoustic wave element, comprising:
a diamond layer;
an alumina nitride layer provided on the diamond layer;
a silicon oxide layer provided on the alumina nitride layer; and
a pair of electrodes provided between the alumina nitride layer and the silicon oxide layer, the electrodes applying a voltage to the alumina nitride layer, wherein
if a thickness of the alumina nitride layer is represented by $H_1$, a thickness of the silicon oxide layer is represented by $H_2$, a wavelength of a surface acoustic wave is represented by λ, x is defined as $x=2\pi H_1/\lambda$, and y is defined as $y=2\pi H_2/\lambda$, (x, y) meets all of formulas 1 to 4, the formula 1 being $y \leq 0.750 \times x + 0.325$, the formula 2 being $y \leq -0.300 \times x + 1.690$, the formula 3 being $y \geq -0.500 \times x + 0.950$, the formula 4 being $y \geq 0.700 \times x - 0.610$.

2. A surface acoustic wave element comprising:
a diamond layer;
an alumina nitride layer provided on the diamond layer;
a silicon oxide layer provided on the alumina nitride layer; and
a pair of electrodes provided between the alumina nitride layer and the silicon oxide layer, the electrodes applying a voltage to the alumina nitride layer, wherein
if a thickness of the alumina nitride layer is represented by $H_1$, a thickness of the silicon oxide layer is represented by $H_2$, a wavelength of a surface acoustic wave is represented by λ, x is defined as $x=2\pi H_1/\lambda$, and y is defined as $y=2\pi H_2/\lambda$, (x, y) meets all of formulas 5 to 8, the formula 5 being $y \leq 0.818 \times x + 0.682$, the formula 6 being $y \leqq -0.266 \times x + 2.960$, the formula 7 being $y \geqq -0.700 \times x + 2.200$, the formula 8 being $y \geqq 0.750 \times x - 0.700$.

3. A surface acoustic wave element comprising:
a diamond layer;
an alumina nitride layer provided on the diamond layer;
a silicon oxide layer provided on the alumina nitride layer; and
a pair of electrodes provided between the alumina nitride layer and the silicon oxide layer, the electrodes applying a voltage to the alumina nitride layer, wherein
if a thickness of the alumina nitride layer is represented by $H_1$, a thickness of the silicon oxide layer is represented by $H_2$, a wavelength of a surface acoustic wave is represented by $\lambda$, x is defined as $x = 2\pi H_1/\lambda$, and y is defined as $y = 2\pi H_2/\lambda$, (x, y) meets all of formulas 13 to 16, the formula 13 being $y \leqq -0.889 \times x + 6.556$, the formula 14 being $y \leqq 0.333 \times x + 2.767$, the formula 15; being $y \geqq -0.700 \times x + 3.800$, the formula 16 being $y \geqq 0.300 \times x + 1.800$.

4. The surface acoustic wave element according to claim 1, wherein
if a thickness of the electrodes is represented by $H_3$ and a value Z is defined as $Z = 2\pi H_3/\lambda$, Z is equal to or smaller than 0.35.

* * * * *